United States Patent [19]

Hughes et al.

[11] Patent Number: 4,981,408

[45] Date of Patent: Jan. 1, 1991

[54] DUAL TRACK HANDLING AND PROCESSING SYSTEM

[75] Inventors: John L. Hughes, Rodeo; Thomas E. Shula, Palo Alto; Carlos E. Rodriguez, Redwood City, all of Calif.

[73] Assignee: Varian Associates, Inc., Palo Alto, Calif.

[21] Appl. No.: 452,449

[22] Filed: Dec. 18, 1989

[51] Int. Cl.$^5$ .............................................. B65G 1/06
[52] U.S. Cl. ................................. 414/217; 118/719; 414/222
[58] Field of Search ............... 414/217, 222, 225, 226, 414/331, 403, 416; 118/500, 719

[56] References Cited

U.S. PATENT DOCUMENTS

| | | | |
|---|---|---|---|
| 4,498,832 | 2/1985 | Corville | 414/217 |
| 4,500,407 | 2/1985 | Boys et al. | 414/217 X |
| 4,592,306 | 6/1986 | Gallego | 414/217 X |
| 4,643,629 | 2/1987 | Takahashi et al. | 414/217 X |
| 4,682,927 | 7/1987 | Southworth et al. | 414/217 |
| 4,701,096 | 10/1987 | Fisher, Jr. | 414/331 X |
| 4,721,427 | 1/1988 | Sanders et al. | 414/416 X |
| 4,722,298 | 2/1988 | Rugin et al. | 414/222 X |
| 4,775,281 | 10/1988 | Prentakis | 414/217 X |
| 4,886,412 | 12/1989 | Wooding et al. | 414/217 X |
| 4,892,451 | 1/1990 | Mahler | 414/416 X |
| 4,917,556 | 4/1990 | Stark et al. | 414/217 |

Primary Examiner—Frank E. Werner
Assistant Examiner—Robert S. Katz
Attorney, Agent, or Firm—Peter J. Sgarbossa; Stanley Z. Cole; Gerald M. Fisher

[57] ABSTRACT

A dual track substrate handling and processing system includes an entrance load lock station, an exit load lock station and a plurality of substrate processing stations, all positioned above a transfer vacuum chamber. The load lock station and each processing station are configured to hold two vertically oriented workpieces. A transport system conveys workpieces two at a time from parallel input cassettes to the entrance load lock station. The transport system includes a transport assembly that simultaneously advances two workpieces from each station to the next station; thus workpieces are processed two at a time in the same environment in each processing station and system throughput is correspondingly increased.

10 Claims, 8 Drawing Sheets

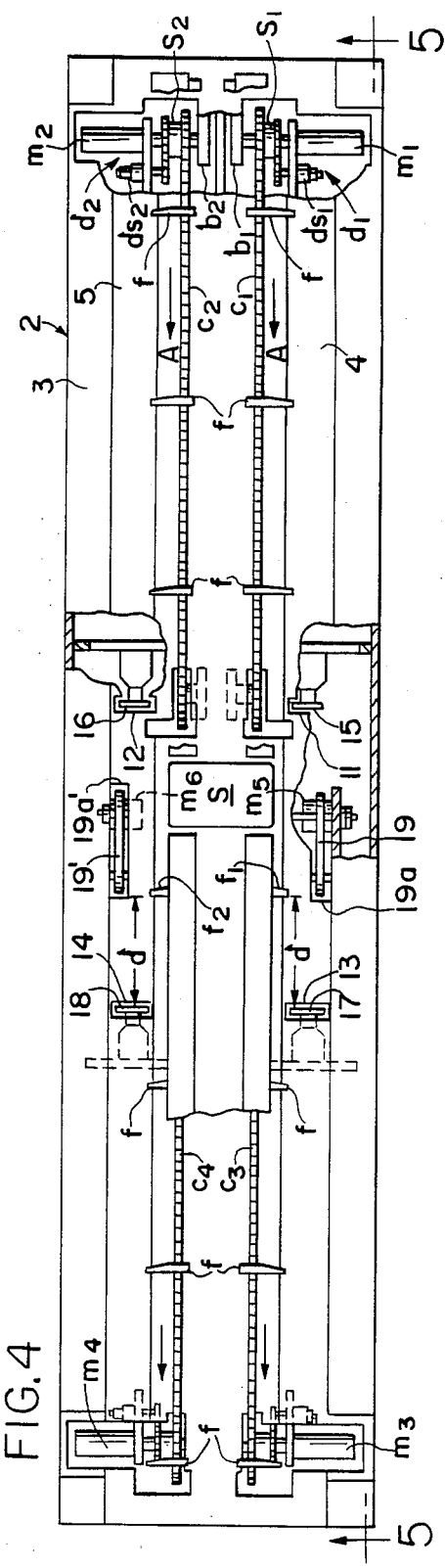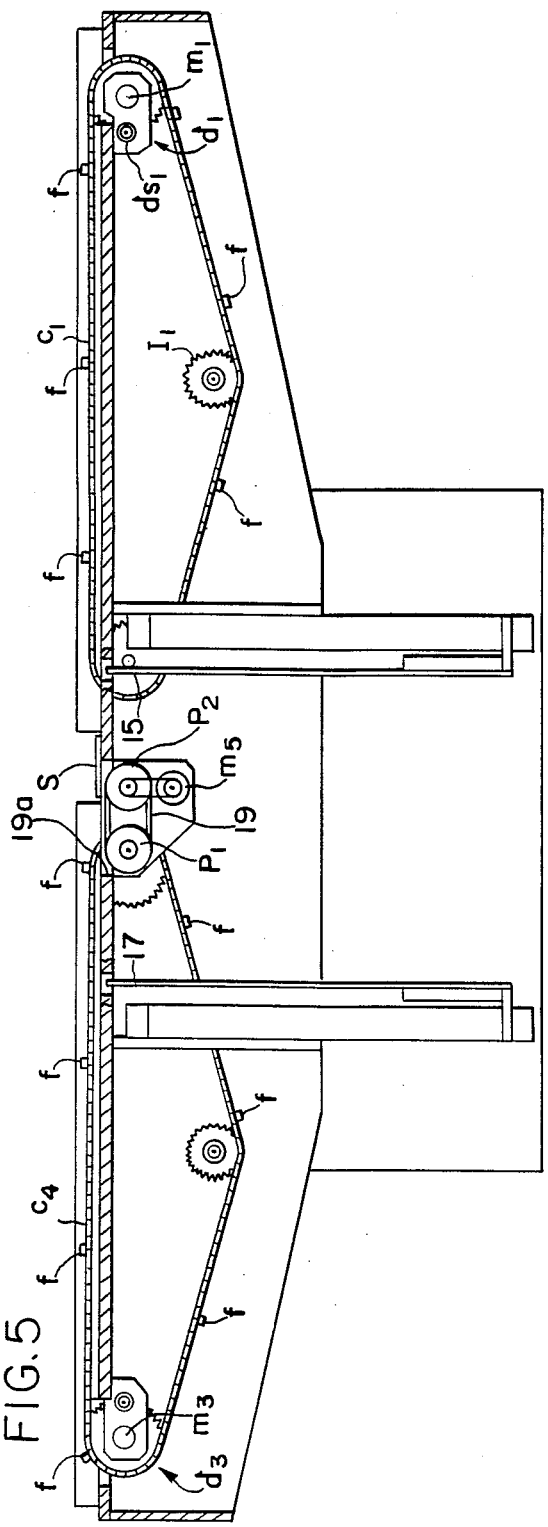

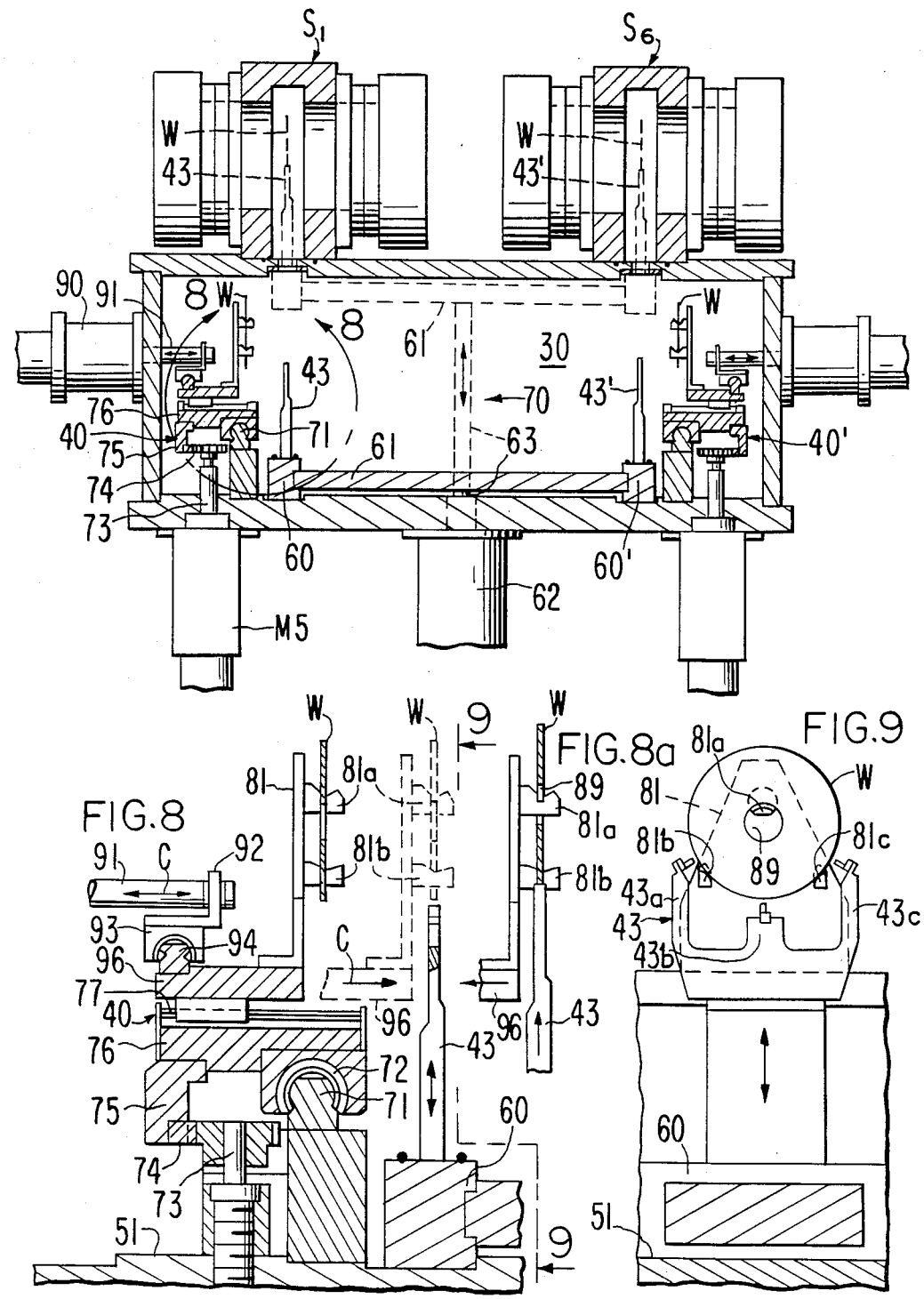

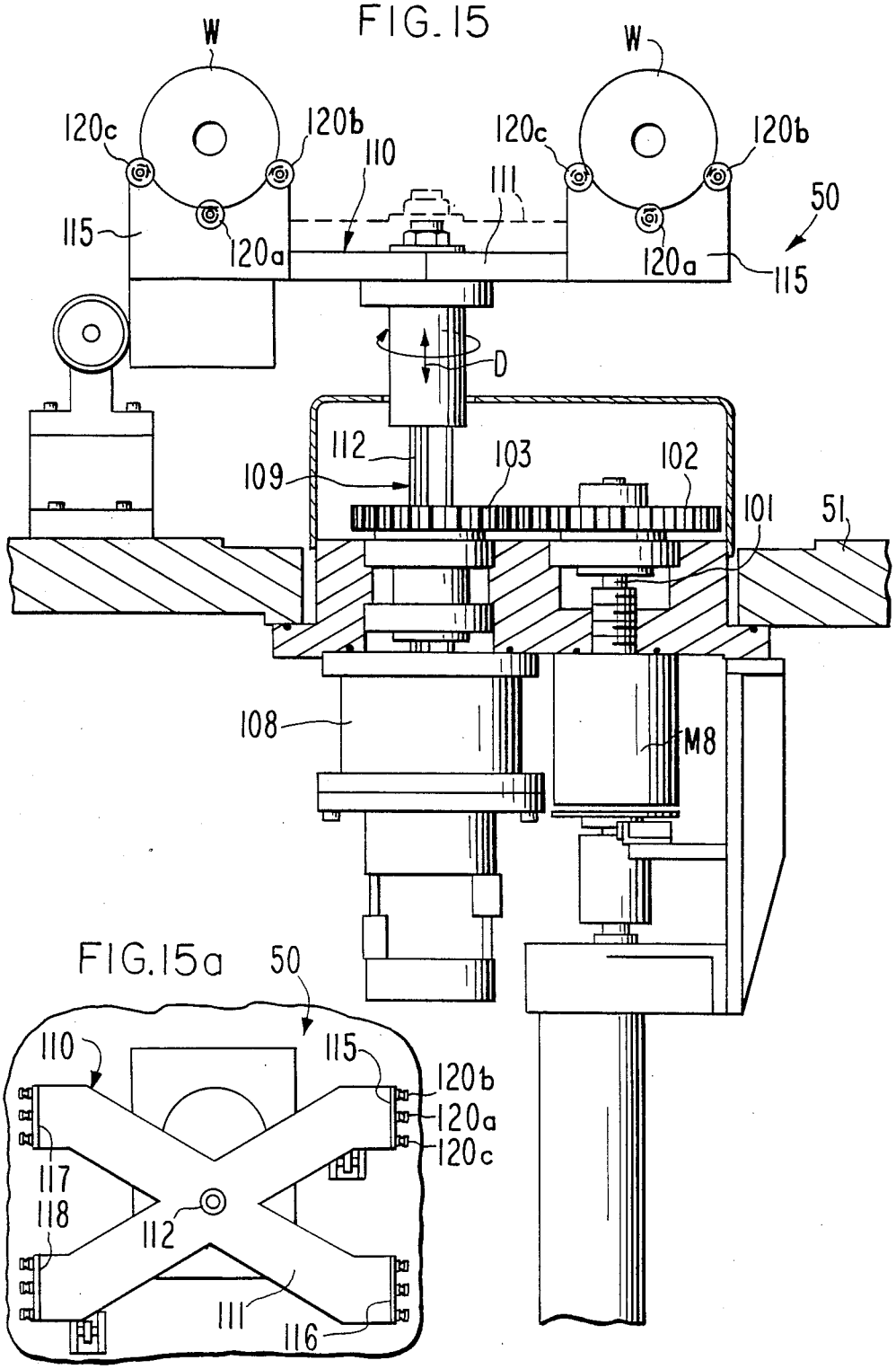

DUAL TRACK HANDLING AND PROCESSING SYSTEM

FIELD OF THE INVENTION

This invention relates to the field of handling and processing vertically oriented disk-like workpieces and in particular to a system for simultaneously processing N workpieces sequentially in each of several processing stations.

BACKGROUND OF THE INVENTION

It has become increasingly important to transport thin workpieces, such as semiconductor wafers and substrates for magnetic disks, from a cassette into, through and out of a vacuum processing system, and back into a cassette. One such system is described in U.S. Pat. No. 4,500,407 which is assigned to the assignee of the present invention and which is incorporated herein by reference.

The above-referenced system has performed extremely well in important semiconductor wafer coating applications and in coating magnetic disk substrates for use in computer memory applications. However, the above system has throughput limitations since each processing station in the referenced system is designed to accommodate a single workpiece and the transport system described in this prior art system is designed to transfer a single workpiece from an entrance load lock sequentially through a plurality of processing stations to an exit load lock.

SUMMARY OF THE INVENTION

The present invention describes a system for handling and processing vertically oriented workpieces which greatly expands the throughput capacity compared to prior art systems which process only a single workpiece in each processing station.

This system includes a cassette conveyor assembly for moving N (where N is an integer greater than 1) cassettes carrying vertically oriented workpieces along parallel tracks. Cassette assembly lift blades situated beneath the tracks and extendable through slots in the tracks are adapted to lift N workpieces, one from each of the parallel cassettes, to a transfer position above the cassettes. An entrance load lock door adapted to receive N workpieces is movable from the transfer position, where the door receives N workpieces from the cassette assembly lift blades, to a position where it sealingly engages the entrance load lock, which is then evacuated. The entrance load lock station, together with a plurality of processing stations and an exit load lock station, are positioned above a vacuum transfer chamber.

The system also includes a vertical transport assembly which includes N lift blades for the entrance load lock station, N lift blades for each of the workpiece processing stations and N lift blades for the exit load lock station. Each lift blade is adapted to elevate a workpiece from the transfer chamber into the station above the lift blade. The lift blades are carried on a support means which sealingly engages the entrance load lock station, the exit load lock station and the processing stations to seal off the transfer chamber from the load locks and the processing stations when the lift blade support means is in its elevated position. When in this elevated position, each of the N workpieces on a lift blade in a given processing station is processed in the same environment. For example, each of N workpieces may be heated at a heating station and each of N workpieces in a given processing station may be sputter-coated while held in N lift blades associated with the given processing station. The vertical transport assembly also serves to lower the lift blades and the workpieces supported thereon into the transfer chamber.

The transfer chamber includes a horizontal transport assembly. The horizontal transport assembly includes workpiece support means and the horizontal transport assembly and vertical transport assembly are movable relative to one another to cooperate in transferring workpieces from the vertical transport assembly to the workpiece support means on horizontal transport assembly and from the workpiece support means on the horizontal transport assembly to the vertical transport assembly. The horizontal transport assembly includes an input side transport assembly which is linearly translatable in a horizontal direction for effecting a simultaneous one station shift of all workpieces carried on the input side transport assembly. In this manner, N workpieces positioned on the workpiece support means on the input side transport assembly below the entrance load lock are shifted to positions below a first one of the processing stations and N workpieces positioned on the workpiece support means on the input side transport assembly below each of the processing stations are simultaneously shifted to positions associated with a successive station, the shifts being directed toward the exit load lock station.

In one U-shaped embodiment of the invention the transfer chamber includes a turnaround station and an output side transport assembly. The turnaround station includes a rotatable member having a first end which supports N workpieces and a second end which also supports N workpieces. The member is also vertically translatable to effect transfer of N workpieces from N workpiece support means carried on the input side transport assembly to N workpiece supports on a selected one of the ends of the turnaround member and (after rotation) from the selected end of the turnaround member to workpiece supports carried on an output side transport assembly. The output side transport assembly operates in the same manner as the input side transport assembly and effects simultaneously horizontal transport of N workpieces from the turnaround station to a first processing station on the output side of the system and from each processing station on the output side of the system to a successive station on the output side of the system. The exit load lock station is the last station in the system.

An exit load lock door associated with the exit load lock station transports workpieces from the exit load lock station to a position above the tracks of the cassette conveyor assembly. Output lift blades situated beneath the tracks are extendable through slots in the tracks to engage the N workpieces carried on the exit load lock door. The output lift blades are then lowered beneath the tracks, depositing the N processed workpieces in N parallel cassettes.

BRIEF DESCRIPTION OF THE DRAWINGS

FIG. 4 shows a plan view of the dual track cassette conveyor.

FIG. 5 shows a cross-sectional view of the cassette conveyor of FIG. 4 taken along the line 5—5 of FIG. 4.

FIG. 7 shows a cross sectional view taken along line 7—7 of FIG. 1.

FIG. 8 shows an enlarged cross-sectional view of the portion of FIG. 7 delineated by line 8—8.

FIG. 8a shows a lift blade in an intermediate, workpiece exchange position.

FIG. 9 shows a cross-sectional view taken along lines 9—9 of FIG. 8.

FIG. 15 shows a cross-sectional view taken along line 15—15 of FIG. 14.

FIG. 15a shows a plan view of the workpiece carrier assembly of the turnaround station.

DETAILED DESCRIPTION

Figure 1:
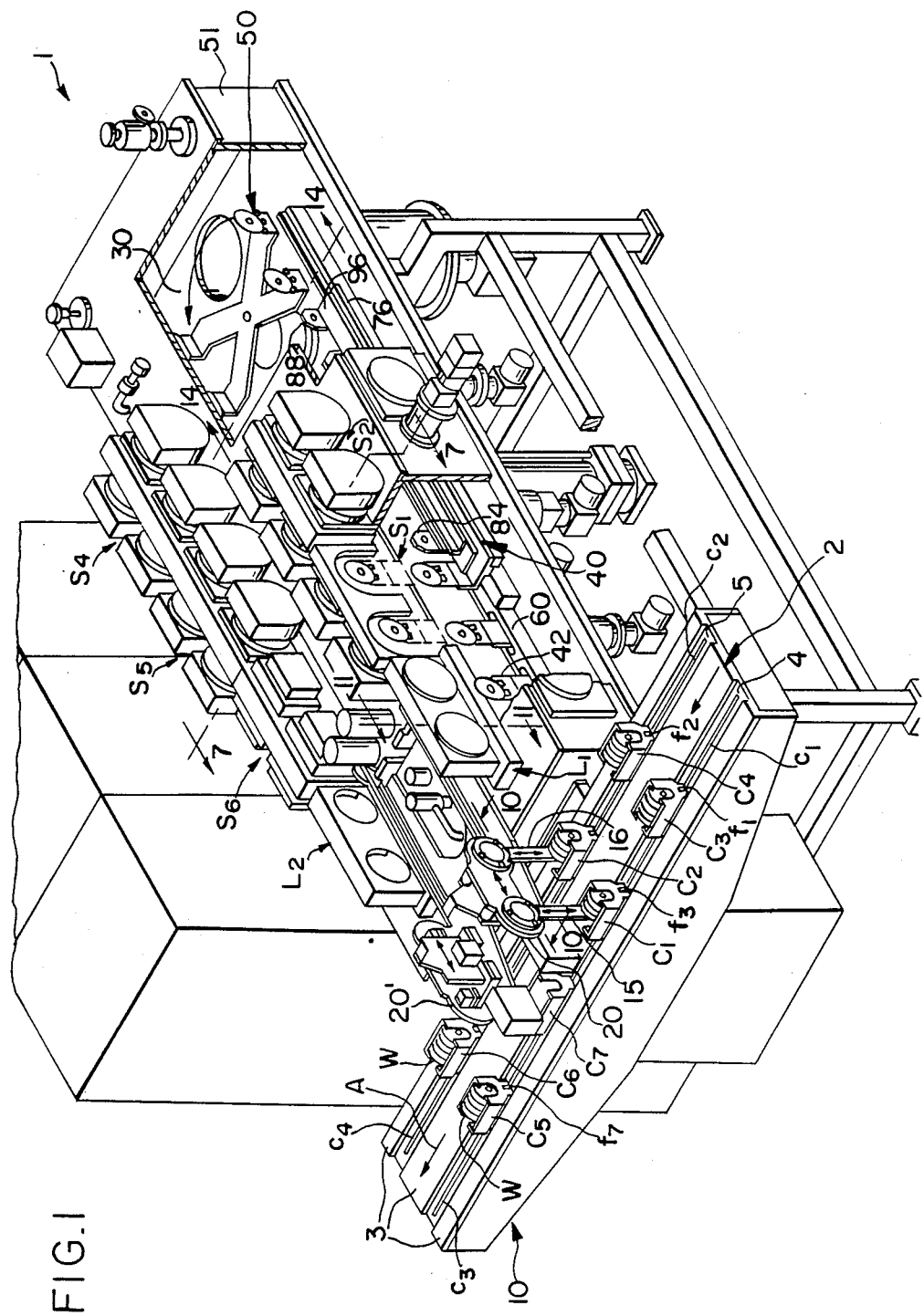
FIG. 1 shows a partially cut-away perspective view of one embodiment of the dual track sputtering apparatus of the present invention.

FIG. 1 shows a partially cut-away prospective view of one embodiment of dual track system 1 of the present invention for handling and processing a plurality of thin, vertically oriented workpieces W. The workpieces may be computer memory disks known as hard disks, magneto optic disks or semiconductor wafers.

System 1 includes dual track cassette conveyor 10; input lift blades 15 and 16; moveable load lock door assembly 20 (shown in more detail in FIGS. 10-12); entrance load lock station $L_1$ also called load lock $L_1$; processing stations $S_1$ through $S_6$; transfer vacuum chamber 30, which houses lift beam assembly 70 (FIG. 7); input transport beam assembly 40, workpiece turnaround assembly 50; output transport beam assembly 40′ (FIG. 7); exit load lock station $L_2$ also called unload lock $L_2$; moveable unload lock door assembly 20′; and a pair of output lift blades 17 and 18 (FIG. 4).

Figure 2:
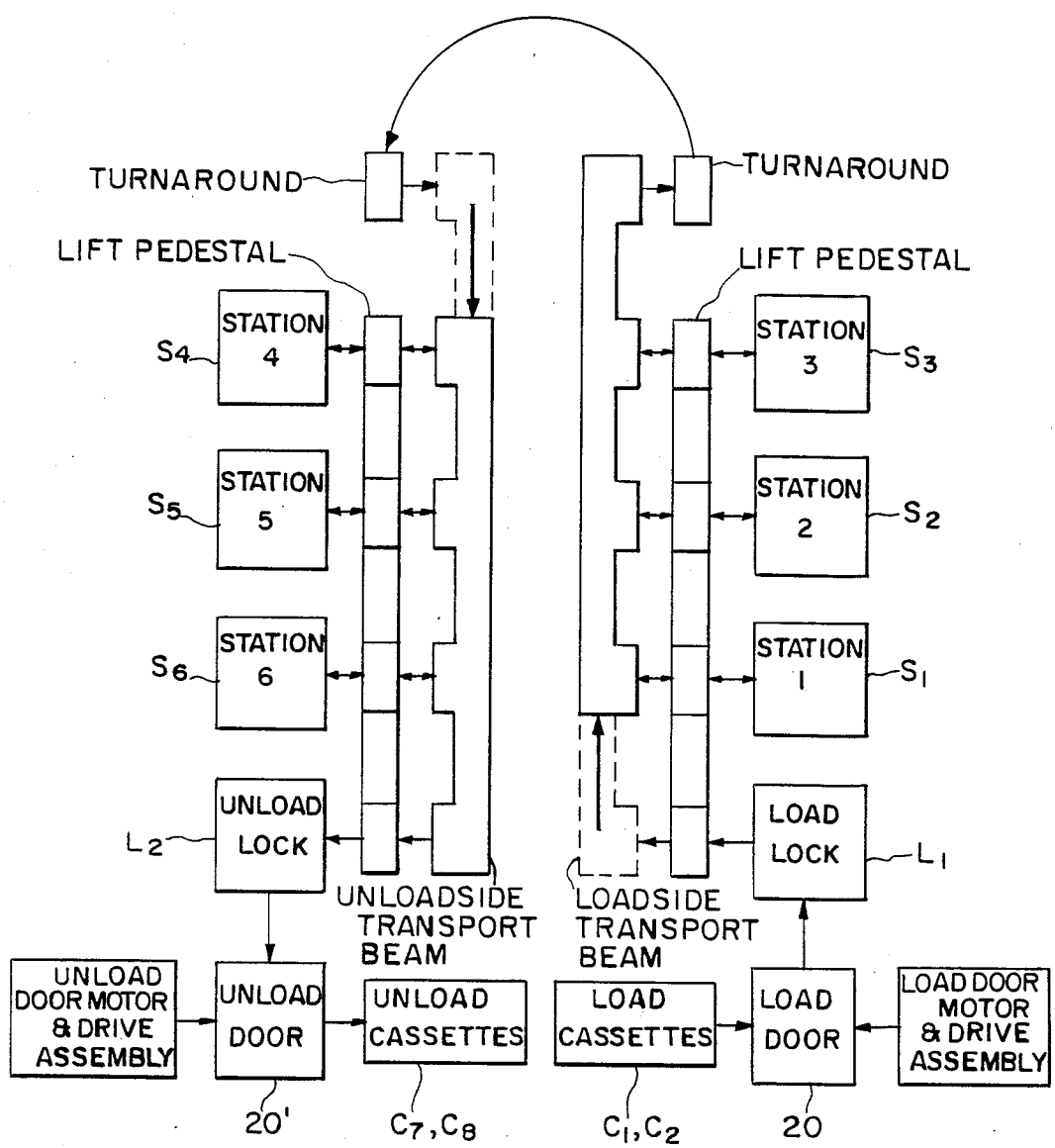
FIG. 2 shows a schematic diagram of the dual track sputtering apparatus of FIG. 1 which illustrates the flow of pairs of workpieces through the apparatus.
Figure 3:
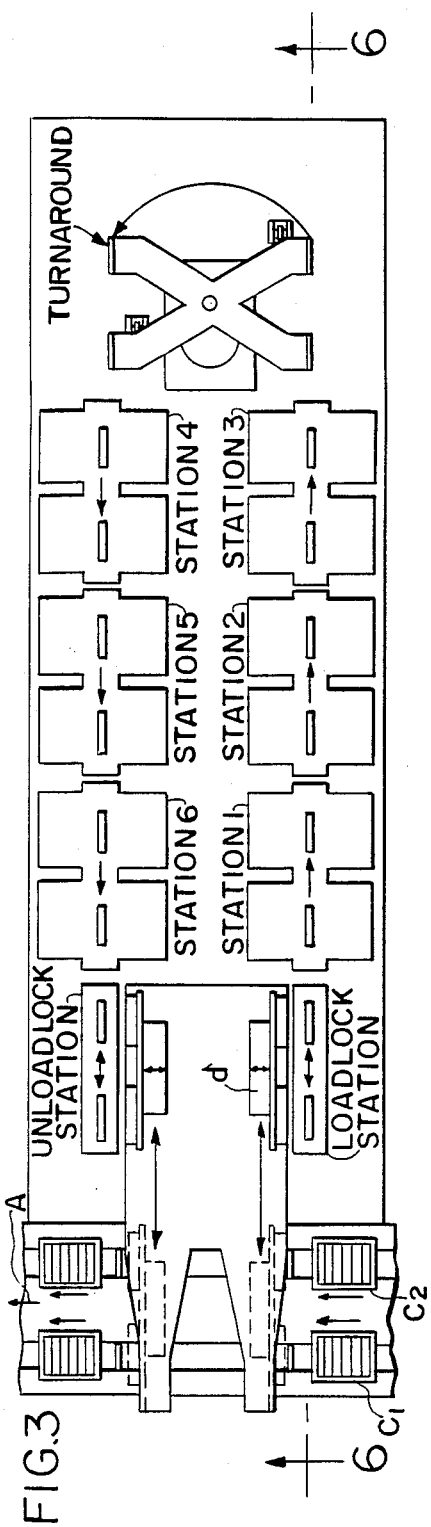
FIG. 3 shows a partially schematic plan view of the dual track sputtering apparatus of FIG. 1 which illustrates the flow of workpieces through the apparatus of FIG. 1.

FIGS. 2 and 3 provide an overview of the operations of workpiece processing system 1. The description of the mechanisms employed to achieve these operations is provided in connection with subsequent figures.

FIG. 2 shows the flow pattern of workpieces through the dual track processing system 1. Workpieces are loaded from load cassettes $C_1$ and $C_2$ to a load lock door. The load lock door is then translated by the load door drive assembly to entrance load lock station $L_1$ and sealed thereto. The entrance load lock station is then evacuated and the workpieces lowered on the lift pedestal to a position beneath the load lock where they are then transferred to the load side transport beam. The load side transport beam then transports the workpieces to a position beneath station 1 where they are transferred back to the lift pedestal (beam) and raised into station 1 for processing. The load side transport beam then returns to the starting position where it is in a position to receive additional workpieces from load lock 1. After processing in station 1 is complete, workpieces are simultaneously removed from station 1 and load lock $L_1$ by lowering the lift pedestal. The workpieces are then transferred to the load side transport beam and advanced to the next station. This process is repeated until the workpieces reach the turnaround station where they are rotated through 180° and transferred back to the unload side transport beam and conveyed successively through the process stations to the exit load lock station $L_2$ also called unload lock $L_2$ where they are transferred to the unload lock door which is linearly translated to a position above unload cassettes $C_7$ and $C_8$ and the workpieces are then moved to the unload cassettes and the processing operation is complete.

FIG. 3 shows a plan view of dual track processing system 1. Cassettes $C_1$ and $C_2$ are advanced in parallel until workpieces in their leading slots are positioned above a transfer apparatus which transfers the workpieces to load lock door d shown in dashed lines in FIG. 3. Load lock door d is then transferred to the load lock station and engaged therewith to transfer the workpieces into the load lock station. Two workpieces in the load lock station are then transferred from the load lock two-by-two through stations $S_1$, $S_2$, and $S_3$ to the turnaround station. All transfers by the transport beam on the load side occur simultaneously so that when the system is running, workpieces at the load lock station, station 1, station 2 and station 3 are simultaneously transferred to station 1, station 2, station 3 and the turnaround station, respectively. The pair of workpieces at the turnaround station are then rotated to the output (unload) side of the system. The workpieces on the unload side of the turnaround station and workpieces in station 4, station 5, and station 6 are simultaneously transferred by the unload side transport beam to station 4, station 5, station 6, and the unload lock station, respectively. The apparatus for accomplishing these simultaneous dual transfers are explained in detail in conjunction with the remaining figures.

Dual track cassette conveyor 10 is shown in more detail in FIGS. 4 and 5. Top surface 3 of housing 2 of dual track cassette conveyor 10 includes parallel grooves 4 and 5 which are dimensioned to slidably accommodate a plurality of cassettes $C_1$–$C_6$ (shown in FIG. 1). Input (load) side parallel chains $c_1$ and $c_2$ are driven by motors $m_1$ and $m_2$, respectively. Idler gear $I_1$ tensions chain $c_1$ and an identical idler gear (not shown) tensions chain $c_2$. Gear drives $d_1$ and $d_2$ transmit rotary motion from motors $m_1$ and $m_2$ to sensor disks $ds_1$ and $ds_2$ respectively. One revolution of a sensor disk corresponds to the advancement of a chain by an amount which amount which advances a cassette by one slot. Shafts $s_1$ and $s_2$ are supported in housing 2 by bearings $b_1$ and $b_2$, respectively. Rigid fingers f attached to chains $c_1$ and $c_2$ simultaneously advance cassettes $C_i$ (not shown in FIG. 4) in grooves 4 and 5 respectively in the direction indicated by arrow A by pushing against the outside rear of cassettes $C_i$. During the advance of cassettes $C_i$, input lift blades 15 and 16 are in their retracted position beneath slots 11 and 12 in housing 2 as shown in FIGS. 4 and 5.

Output (unload) side parallel chains $c_3$ and $c_4$ have the same drive mechanism so that chains $c_3$ and $c_4$ also advance cassettes $C_i$ in direction A. Motors $m_1$ and $m_2$ operate independently of motors $m_3$ and $m_4$ under the direction of the system controller (microprocessor not shown).

As shown in FIGS. 4 and 5, a cassette way station S is located between the pair of input chains $c_1$ and $c_2$ and the pair of unload chains $c_3$ and $c_4$. Way station motor $m_5$ drives pulley $p_2$ in the conventional manner. Belt 19 connects pulley $p_1$ and pulley $p_2$. Slot 19a in groove 4 is dimensioned so that outer top surface of belt 19 protrudes slightly above the surface of slot 4 so that belt 19 frictionally engages a cassette $C_i$ positioned thereon. Rotation of pulley $p_1$ by motor $m_5$ advances a cassette $C_i$ frictionally engaged thereon in the direction A. Motor $m_6$ simultaneously drives belt 19', whose top surface extends through slot 19'a in groove 5, via a similar pulley apparatus to frictionally engage a cassette $C_i$ positioned thereon. Motors $m_5$ and $m_6$ are directed by the controller independently of its operation of the motors for chains $c_1$, through $c_4$.

In operation, the dual track cassette conveyor 10 is initialized by rotating chains $c_3$ and $c_4$ so that fingers $f_1$ and $f_2$ are positioned in their initial position as shown in FIG. 4. This initial position is selected a distance d from slots 13 and 14, where d is selected so that when the outside rear of a cassette is placed against finger $f_1$, the lead slot of the cassette is positioned directly above slot 13. Similarly, the lead slot of a cassette placed against finger $f_2$ is positioned directly above slot 14.

When the chains $c_3$ and $c_4$ have been so initialize, a pair of empty output cassettes is manually placed against fingers $f_1$ and $f_2$ ready to receive processed workpieces.

Alternatively, empty cassettes may be advanced from the way station to the initial unload position.

Workpieces to be processed are loaded into cassettes $C_1$ and $C_2$ (FIG. 1) and chains $c_1$ and $c_2$ advanced in the direction A until the lead slots of cassettes $C_1$ and $C_2$ are positioned directly above slots 11 and 12 in grooves 4 and 5. In general, when cassettes $C_1$ and $C_2$ (FIG. 1) have been simultaneously advanced along grooves 4 and 5 respectfully by the operation of chains $c_1$ and $c_2$ so that corresponding workpieces W in each of cassettes $C_1$ and $C_2$ are positioned above slots 11 and 12 respectively, the chain drive is stopped and lift blades 15 and 16 are extended linearly upward through slots 11 and 12 respectively. The lift blades 15 and 16, as know in the art, are curved to correspond to the curvature of the workpieces and are grooved so they support the workpieces in their vertical orientation as they are lifted clear of cassettes $C_1$ and $C_2$. Such lift blades are shown, for example, in U.S. Pat. No. 4,500,407, commonly assigned herewith, which is incorporated herein by reference. As is also known in the art, cassettes $C_1$ and $C_2$ have open bottoms to accommodate the passage of lift blades 15 and 16. Lift blades 15 and 16 are driven by pneumatic cylinders 15a and 16a under the control of the microprocessor (not shown).

Figure 10:
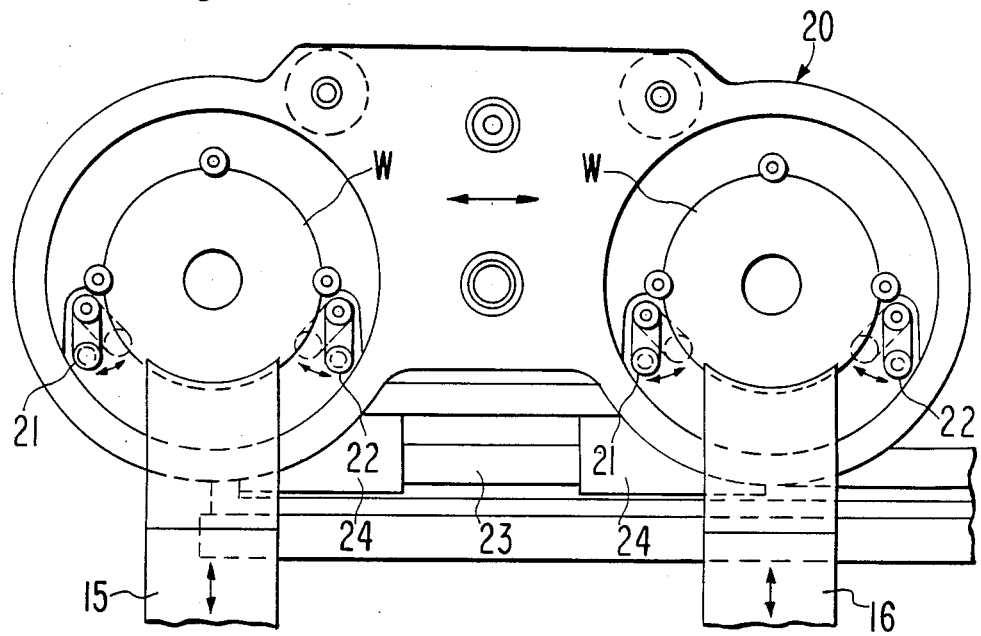
FIG. 10 shows a cross-sectional view taken along line 10—10 of FIG. 1.

Before the lift blades 15 and 16 are extended, load lock door assembly 20 is in its forward position over the cassette conveyer as shown in FIG. 1 and disc pick-up arms 21 and 22 of load lock door assembly 20 are in their open position as shown by the solid lines in FIG. 10. In this position, the distance between the disc pick-up arms is sufficient to accommodate the passage of the workpieces W as the load blades 15 and 16 are extended to the fully extended position shown in FIG. 10. When the load blades have been fully extended, disc pick-up arms 21 and 22 are moved to the closed position (shown in phantom in FIG. 10). In this position disc pick-up arms support the workpiece and the load blades are returned to their retracted position beneath housing 2.

Figure 13:
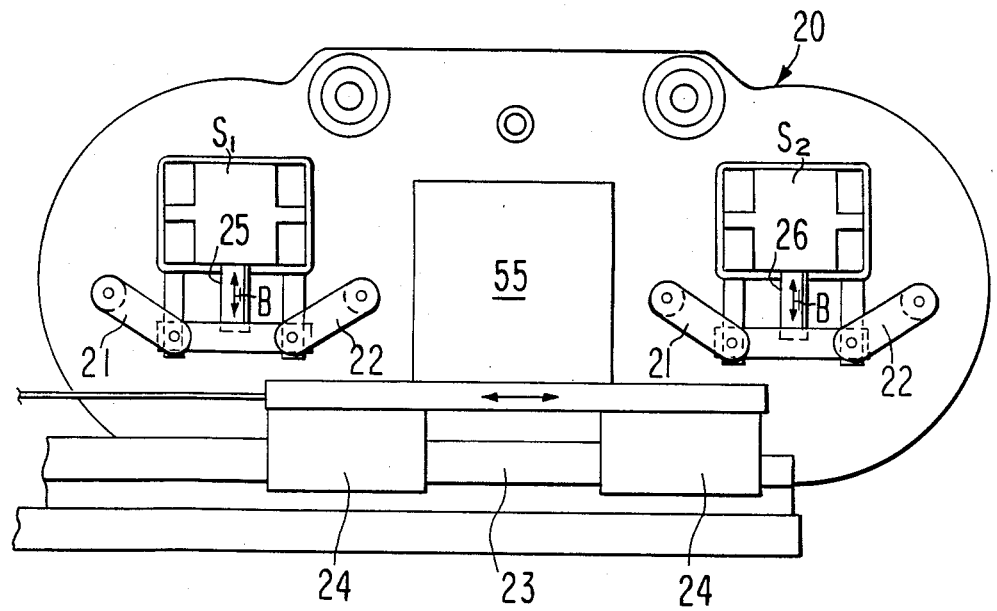
FIG. 13 shows a cross-sectional view taken along line 13—13 of FIG. 11.

FIG. 13 shows a back view of the load lock door shown in FIG. 10. Solenoids $s_1$ and $s_2$ drive shafts 25 and 26 respectively as indicated by arrows B in FIG. 13. When shaft 25 is fully extended, pick-up arms 21 and 22 are in the open position shown in FIG. 10. When shaft 25 is fully retracted, pick-up arms 21 and 22 are in the closed position shown in phantom in FIG. 10.

Figure 11:
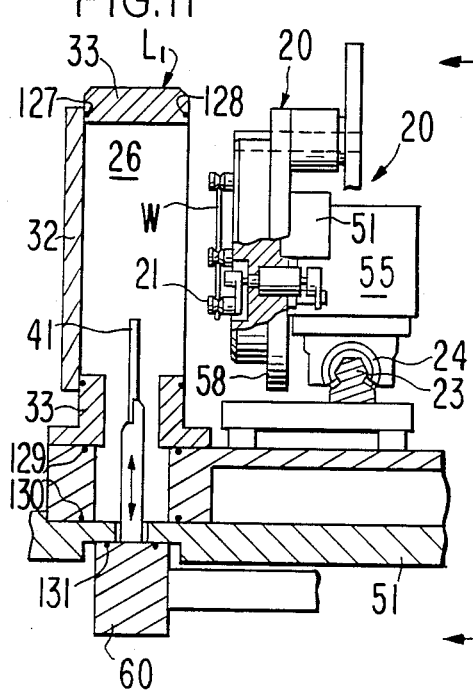
FIG. 11 shows a cross-sectional view taken along line 11—11 of FIG. 1 with the workpiece outside the chamber.

When the pick-up arms 21 and 22 are in the closed position, the workpieces W are supported by the pick-up arms and the load blades 15 and 16 are withdrawn below the surface of housing 2. Load lock door assembly 20 is then translated linearly along rail 23 until it is positioned opposite load lock $L_1$ as shown in FIG. 11. Linear bearing 24 of load lock door assembly 20 permits translation of load lock door assembly 20 from its retracted position shown in FIG. 1 to its extended position opposite load lock $L_1$ shown in FIG. 11. Load lock door assembly 20 is driven along rail 23 by a conventional motor and drive assembly, shown schematically in FIG. 2, under control of the controller (microprocessor) (not shown).

Figure 12:
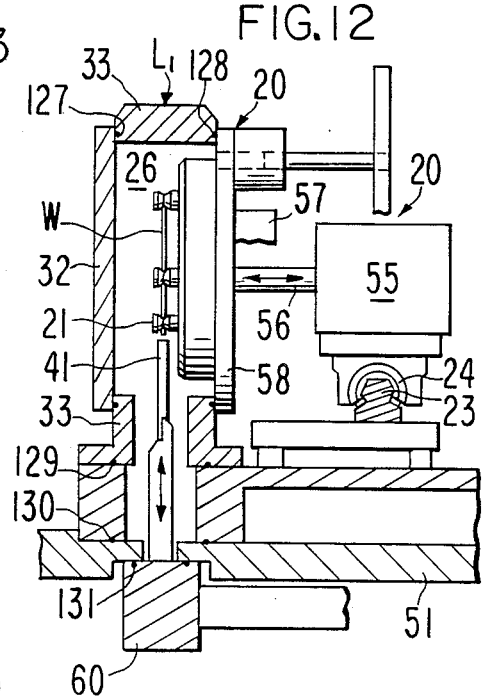
FIG. 12 shows a cross-sectional view taken along the line 11—11 with the workpiece loaded in the chamber.

FIG. 11 shows load lock door assembly 20 in its open position opposite load lock $L_1$. FIG. 12 shows load lock door assembly 20 in its closed position. Input lift beam (pedestal) 60 is in its up position in both FIGS. 11 and 12. In this position lift beam 60 seals against O-ring, 131 and housing 51 of transfer vacuum chamber 30, sealing load lock chamber 26 from transfer chamber 30. With lift beam 60 in its elevated position and load lock door assembly 20 positioned as shown in FIG. 11, pneumatic cylinder 55 is activated by the controller to extend shaft 56 so that load lock door 58 seals against frame 33 and O-ring 128, forming load lock chamber 26. Load lock vacuum chamber 26 is connected to a vacuum pump (not shown) for evacuating chamber 26. Load lock access cover 32 is secured to load lock frame 33 by screws (not shown). O-rings 127-131 provide a vacuum seal between the portions of the housing for chamber 26.

When load lock door 58 is in the extended position shown in FIG. 12, a pair of workpieces W carried by arms 21 and 22 are directly above and in close proximity to load lock lift blades 41 and 42. Arms 21 and 22 are then moved to their open position to transfer workpieces W to load lock lift blades 41 and 42. After the load lock $L_1$ has been evacuated and with door 58 in its extended, closed position, lift beam 60 is lowered to an intermediate workpiece exchange position, as shown in FIG. 1 (this intermediate exchange position is described below in more detail in conjunction with FIG. 8a). Lowering lift beam 60 lowers load lock lift blades 41 and 42 mounted thereon (as well as all of the processing station lift blades 43-48 mounted on lift beam 60) and the workpieces carried thereon into transfer chamber 30. Transfer chamber 30 is a vacuum chamber which is connected to a vacuum pump (not shown).

Load lock lift blades 41 and 42 are similar to lift blades 15 and 16 previously described. Processing station lift blades 43-48 are all mounted on input lift beam 60, but have a slightly different configuration, to be discussed hereinafter in conjunction with FIG. 9, but these differences have no bearing on the mechanics of the transfer of a workpiece from the lift blades 41-48 to input transport beam assembly 40.

Figure 6:
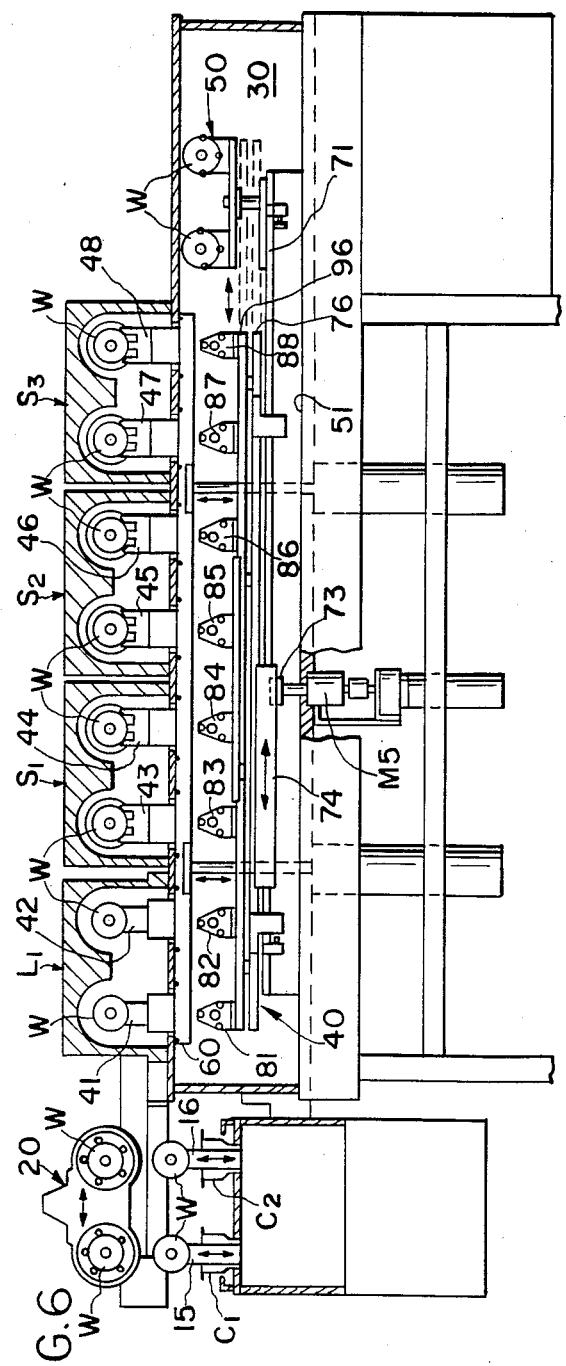
FIG. 6 shows a cross-sectional view taken along line 6—6 of FIG. 3.

The transfer of a workpiece from a lift blade (any of blades 41 through 48) in FIG. 6 to a juxtaposed workpiece support fixture 81 on input beam transport assembly 40 may be understood in conjunction with FIGS. 7 through 9.

FIG. 7 shows, inter alia, a cross section of lift beam assembly 70 and a cross-sectional view of input transport beam assembly 40 and out put transport beam assembly 40'. Lift beam assembly 70 includes input lift beam (pedestal) 60, and output lift beam (pedestal) 60' which are rigidly mounted on lift beam plate 61. Plate 61 is rigidly secured to shaft 63 which is driven by a pair of pneumatic cylinders 62 (only one of which is shown in FIG. 7) under the control of the system controller, not shown. Cylinders 62 are located beneath vacuum transfer chamber 30 and shaft 63 of each cylinder passes through a bellows vacuum feedthrough. If desired, the input and output lift beams could be disconnected and driven by independent air cylinders, but the construction shown in FIG. 7 is more economical.

FIG. 7 shows lift beam assembly 70 in its lower most position (solid lines) and in phantom lines in its uppermost position. In its upper most position, as explained above in conjunction with FIGS. 11 and 12, the load lock is sealed from transfer chamber 30. Similarly, as shown in FIG. 7, when the lift beam assembly is in its uppermost position, all of the process chambers $S_i$ for $i=1, \ldots, 6$ are sealed off from transfer chamber 30.

FIG. 8 shows an enlarged portion of the cross-section of FIG. 7 and FIG. 8a shows a portion of lift beam assembly 70, including the position of lift blade 43 when input lift beam 60 in its intermediate workpiece transfer position.

Input transport assembly 40 includes rail 71 rigidly mounted to housing 51 of transfer vacuum chamber 30. Motor $m_7$ turn shaft 73 and pinion gear 74 attached thereto which translates rack 75 and lower input transport beam 76 along rail 71 on linear bearing 72. Workpiece support fixture 81 is rigidly mounted on upper input transport beam 96 which is slidably mounted on rods 77 attached to transport beam 76. Angle bracket 92 is rigidly attached between shaft 91 of air cylinder 90 and linear slide 93 which is slidably mounted on rail 94 which is rigidly attached to upper transport beam 96. Shaft 91 passes through a bellows vacuum feedthrough.

Workpiece support 81 is adapted to vertically support a thin, disk like workpiece W (shown in FIG. 9) which has a circular central opening 89 therethrough, such as a hard disk. Workpiece support 81 has three notched projections 81a, 81b, and 81c. When a lift blade on beam assembly 70 is in the intermediate position shown in FIG. 8a and workpiece support 81 is aligned with the lift blade 43 as shown in FIG. 8, the notched central projection 81a is aligned with opening 89 and dimensioned to pass therethrough when air cylinder 90 is activated to drive bracket 92, slide 93, upper transport beam 96 and workpiece support 81 in the direction shown by arrow C on rods 77 to its extended position as shown in FIG. 8a. The lower projections 81b and 81c clear the lower portion of workpiece W when workpiece support 81 is so extended with the lift blade 43 in its intermediate position.

Next, lift blade 43 is lowered to its bottom position as shown in FIG. 8 and FIG. 9, which transfers the workpiece W from lift blade 43 to workpiece support 81. Workpiece W then nests in the notches of projections 81a, 81b and 81c as shown in FIG. 9 and in phantom in FIG. 8. Then air cylinder 90 is again activated to retract workpiece support 81 to the position shown in FIG. 8 with workpiece W supported thereon.

In operation, when motor $m_7$ turns shaft 73 and pinion gear 74, rack 75, lower transport beam 76 and upper transfer beam 96 translate together along rails 71 and 94. Shaft 73 passes through a rotary vacuum feedthrough.

FIG. 6 shows transport beams 76 and 96 in their fully retracted position with workpiece supports 81 and 82 beneath load lock $L_1$. In the fully extended position, indicated by the dotted lines in FIG. 6, beams 96 and 76 are extended to turn-station 50 and workpiece support fixtures 81 and 82 occupy the position previously occupied by workpiece support fixtures 83 and 84 respectfully, and in general each workpiece support fixture is translated to the corresponding position at the next station.

Transport beams 76 and 96 are in the fully retracted position shown by the solid lines in FIG. 6 when the workpieces on lift beams 41 and 42 are transferred to workpiece supports 81 and 82 in the sequence of operations described above in connection with FIGS. 7 through 9. Once the transfer is complete both support beams 76 and 96 are translated to their fully extended position by motor $m_7$ which accomplishes the pairwise translation of the workpieces from the load lock station $L_1$ to the first processing station $S_1$ (and in general from each station to the next succeeding station). A workpiece on workpiece support 81 which is transferred to its loading position beneath station $S_1$ by the extension of support beams 96 and 76 to their fully extended position is then transferred from workpiece support 81 to lift blade 43 by reversing the sequence of steps explained above in connection with FIGS. 7 through 9. That is, with lift blade 43 in its lower most position, workpiece support 83 is extended to its fully extended position as shown in phantom in FIG. 8. Lift blade 43 is then raised to its intermediate position, transferring the workpiece from workpiece support 83 to lift blade 43 as shown in FIG. 8a. Workpiece support 83 is then retracted to its fully retracted position as shown in solid lines in FIG. 8 and lift blade 43 then is extended to its fully elevated position to transport the workpiece into the process chamber $S_1$ and simultaneously seal off chamber $S_1$ from transfer chamber 30.

After processing in chamber $S_1$, the sequence of steps explained above is repeated to transfer the workpieces pairwise from process chamber $S_1$ to process chamber $S_2$, and so on.

Workpiece processing stations $S_1$ through $S_6$ (shown in FIG. 3) are not described in detail herein. Station $S_1$ is typically a heating station equipped with infrared high power heating lamps used to raise the temperature of the workpieces positioned therein on lift blades to a desired temperature. In one embodiment, the remaining stations $S_2$ through $S_6$ are sputter coating stations, either as dc or rf. In other embodiments, one or more of the processing stations contains a dc or rf etching apparatus known in the art. Typical sputter coating stations $S_1$ and $S_6$ are shown in cross-section in FIG. 7. When a workpiece is held by lift blade 43 in the extended position shown in FIG. 7, both sides of the workpiece are substantially exposed for sputter coating by sputter apparatus which is known in the art. Lift blade 43, as shown in FIG. 9, includes three prongs 43a, 43b and 43c, each prong supporting a workpiece support projection. The cut away portion of the blade between prongs reduces the surface area of the blade exposed to sputtering in the process stations. Each of the stations $S_1$ through $S_6$ is a vacuum chamber which is connected to a vacuum pump (not shown).

As shown in FIG. 3 and FIG. 6, each station is configured to receive two lift blades on a lift beam pedestal, so that two workpieces are processed simultaneously in the same environment. The environment, typically a vacuum environment, in each process chamber is sealed from the vacuum environment in transfer chamber 30 during processing. As shown in cross-section in FIG. 7, the processing stations, for example stations $S_1$ and $S_6$, are typically configured to permit processing of each workpiece held therein from both sides.

Figure 14:
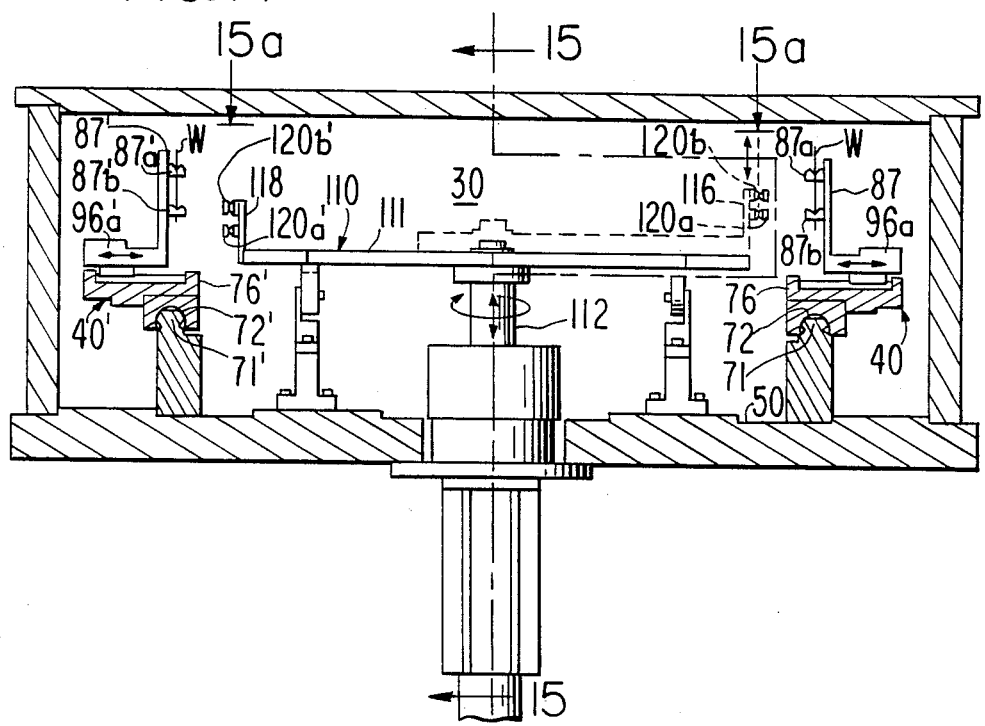
FIG. 14 shows a cross-sectional view taken along line 14—14 of FIG. 1.

FIG. 14 shows a cross-section of workpiece turnaround assembly 50. FIG. 15 shows a cross-section of workpiece turnaround assembly along line 15—15 in a plane perpendicular to the cross-section shown in FIG. 14. A portion of the turnaround assembly 50 is also shown in plan view in FIG. 15a.

Turnaround assembly 50 includes air cylinder 108 which selectively drives shaft 109 and workpiece carrier assembly 110 rigidly attach thereto in the direction indicated by arrow D from a lowered position to a raised position indicated by the phantom lines in FIG. 15. Shaft 109 passes through a bellows vacuum feed-through through housing 51.

Turnaround assembly 50 also includes motor $m_8$ which turns shaft 101 (which passes through a rotary vacuum feedthrough) and gear 102 attached thereto. Gear 102 engages gear 103 which has teeth (not shown) extending into longitudinal grooves 112 in shaft 109 is slidable with respect to gear 103 as the teeth slide in grooves 112.

FIG. 14 shows a workpiece W supported by three notched projections 87a, 87b, and 87c (87c is not shown since it is behind projection 87b) of workpiece support 87 attached to upper transport beam 96a. These three projections are identical to projections 81a, 81b, and 81c shown in FIG. 9 for workpiece support 81. Turnaround station carrier assembly 110 is shown in top view in FIG. 15a and in perspective view in FIG. 1. Carrier assembly 110 includes a generally x-shaped frame 111 mounted at its center on shaft 112. Frame 111 has vertical end sections 115, 116, 117, and 118 extending upward from the plane of the frame. Each end section carries three notched support projections 120a, 120b, and 120c which extend horizontally outward from end sections 115 through 118.

A workpiece is transferred from workpiece support 87 to workpiece carrier assembly 110 by first activating air cylinder 108 to position assembly 110 in its lowest (retracted) position as shown by the solid lines in FIGS. 14 and 15. Upper input transport beam 96a is then extended toward the workpiece turnaround carrier assembly 50 as explained above in connection with FIG. 8 so that workpiece W is positioned slightly above the three support projections 120a, 120b, and 120c which are arranged along the arc of a circle in such a manner that they do not interfere with projections 87b and 87c when beam 96 is in its extended position. Air cylinder 108 is then energized to raise workpiece turnaround assembly 110 to its elevated position which transfers the workpiece to the turnaround carrier assembly 110. Beam 96 is then retracted and motor $m_8$ energized to rotate the turnaround carrier assembly 110 by 180°.

Reversing the steps explained above, workpieces are transferred to the output (unload) side workpiece supports on the output beam transport assembly 40'. Once loaded on the output transport beam assembly, workpieces progress two-by-two through stations $S_4$ through $S_6$ on the unload side in the manner explained above in connection with the input transport beam assembly. The input and output transport beam assemblies move synchronously under control of the system controller. The workpieces are then transferred to the output blades 17 and 18 by reversing the steps explained in conjunction with input blades 15 and 16. Output blades 17 and 18 are then lowered through slots 13 and 14 in housing 2 to deposit the workpieces in the output cassettes.

Returning now to FIGS. 4 and 5, when system 1 is initialize and workpieces begin their transit through the system, several pairs of workpieces are removed from cassettes $C_1$ and $C_2$ before the first processed workpieces are received by output lift blades 17 and 18 for unloading into a pair of output cassettes. Thus, the initial pair of input cassettes is emptied before the pair of cassettes receiving the processed workpieces is full. Way station S is employed to store the pair of empty input cassettes while the next pair of input cassettes is advanced to continue feeding workpieces into the system and while the initial pair of output cassettes is being filled. When the initial pair of output cassettes is filled, operation of belts 19 and 19' advance the stored, empty original pair of input cassettes so that their leading slots are positioned to receive processed workpieces.

The above description is intended to be exemplary and not limiting and in view of the above disclosure, many modifications will be obvious to one of average skill in the art without departing from the scope of the invention. For example, while the transfer apparatus has been particularly described with respect to workpieces having a central hole, the workpiece supports on the input and output lift beams may be configured in a manner similar to the workpiece supports on turnaround station 50 so that workpieces, such as semiconductor wafers, may be transferred back and forth between the transport lift blades and the transport beam apparatus without employing a central aperture in the workpiece, but rather by engaging the outer edge of the workpiece in a plurality of locations. Similarly, while the above embodiments have shown a dual track system, the system may be configured to permit three or more parallel tracks. In such a case, the load lock door is reconfigured to accommodate three or more workpieces and each processing station is reconfigured to accommodate three or more workpieces with a corresponding increase in the number of workpiece supports on the transfer beam and lift blades on the lift pedestal.

Finally, while the embodiment shown in FIG. 1 is u-shaped, the turnaround station may be eliminated and the process stations 4, 5 and 6 and the unload lock aligned linearly with input stations $S_1$, $S_2$ and $S_3$. Clearly also the number of stations may be increased or decreased.

We claim:

1. A system for handling and processing thin workpieces, said workpieces being vertically oriented during said handling and processing, said system comprising:
   a transfer chamber;
   an entrance load lock station;
   a plurality of processing stations;
   an exit load lock station, each of said stations being positioned above said transfer chamber, each of said stations being adapted to receive the same number N of vertically oriented workpieces, where N is an integer greater than 1;

vertical transport means for lowering workpieces from each of said stations into said transfer chamber and for raising workpieces from said transfer chamber into said stations, said vertical transport means comprising N lift blades for each of said stations, each of said lift blades being configured to support a vertically oriented workpiece;

horizontal transport means in said transfer chamber for transferring workpieces horizontally in said transfer chamber, said horizontal transport means including workpiece support means for supporting vertically oriented workpieces, said horizontal transport means cooperating with said vertical transport means to transfer workpieces from said vertical transport means to said horizontal transport means and from said horizontal transport means to said vertical transport means, said horizontal transport means comprising at least an input side transport assembly carrying a first portion of said workpiece support means, said input side transport assembly being linearly translatable in a first horizontal direction for effecting a simultaneous 1-station shift of workpieces, so that N workpieces positioned on said workpiece support means on said input side transport assembly below said entrance load lock station are shifted to positions below a first one of said processing stations and N workpieces positioned on said workpiece support means on said input said transport assembly below each of said processing stations are simultaneously shifted to positions associated with a successive station so that simultaneous one-station shifts of all of the workpieces on said input side transport assembly are effected, said shifts being directed toward said exit load lock station.

2. A system for handling and processing workpieces as in claim 1 wherein said input side transport assembly includes a member which is linearly translatable in a second horizontal direction transverse to said first horizontal direction, said workpiece support means of said input side transport assembly being attached to said first member.

3. A system for handling and processing workpieces as in claim 1 wherein said transfer chamber is a vacuum chamber and wherein said vertical transport means includes support means for said lift blades, said support means simultaneously sealing against said entrance load lock station, said exit load lock station and said processing stations when said support means is in a first, elevated position to isolate said load lock stations and said processing stations from said transfer vacuum chamber.

4. A system for handling and processing workpieces as in claim 3 further including vacuum pumping means for evacuating said load lock stations and said processing stations.

5. A system for handling and processing workpieces as in claim 1 wherein said vertical transport means includes means for lowering said lift blades from an intermediate position in said transfer chamber to a lowermost position to effectuate transfer of workpieces from said lift blades to said workpiece support means and for raising said lift blades from said lowermost position to said intermediate position to effectuate transport of workpieces from said workpiece support means to said lift blades.

6. A system for handling and processing workpieces as in claim 3 wherein said support means for said lift blades comprises two parallel beams connected by a support plate.

7. A system for handling and processing workpieces as in claim 1 further including a cassette conveyor assembly comprising:

means for moving N cassettes in parallel along N parallel tracks;

blade means, positionable beneath said tracks and extendable therethrough, for elevating N workpieces, one from each of said N cassettes, to a position above said cassettes.

8. A system for handling and processing workpieces as in claim 7 wherein said entrance load lock station includes a door adapted to support N workpieces, and further including means for moving said door from a position above said tracks for receiving N workpieces from said blade means to a position wherein said door is sealingly engaged with said entrance load lock station.

9. A system for handling and processing workpieces as in claim 8 wherein said means for moving comprises means for linearly translating said door in a first direction from said position above said tracks to an intermediate position adjacent said load lock station and means for linearly translating said door from said intermediate position in a second direction transverse to said first direction to sealingly engage said load lock station.

10. A system for handling and processing workpieces as in claim 1 further including in said transfer chamber a turnaround station and an output side transport assembly carrying a second portion of said workpiece support means, said output side transport assembly being linearly translatable in a horizontal direction; said turnaround station comprising a member having a first end having N workpiece supports and a second end having N workpiece supports, said member being rotatable and being vertically translatable to effect transfer of N workpieces from said workpiece support means carried on said input side transport assembly to said N workpiece supports on a selected one of said first and said second ends and to effect transfer of N workpieces on said selected one of said first and said second ends to said workpiece support means carried on said output side transport assembly.

* * * * *